US 9,871,019 B2

(12) United States Patent
Prabhu et al.

(10) Patent No.: US 9,871,019 B2
(45) Date of Patent: Jan. 16, 2018

(54) FLIPPED DIE STACK ASSEMBLIES WITH LEADFRAME INTERCONNECTS

(71) Applicant: Invensas Corporation, San Jose, CA (US)

(72) Inventors: Ashok S. Prabhu, San Jose, CA (US); Rajesh Katkar, San Jose, CA (US); Liang Wang, Milpitas, CA (US); Cyprian Emeka Uzoh, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 15/209,034

(22) Filed: Jul. 13, 2016

(65) Prior Publication Data

US 2017/0018485 A1    Jan. 19, 2017

Related U.S. Application Data

(60) Provisional application No. 62/219,015, filed on Sep. 15, 2015, provisional application No. 62/194,051, filed on Jul. 17, 2015.

(51) Int. Cl.
*H01L 25/065* (2006.01)
*H01L 23/495* (2006.01)
(Continued)

(52) U.S. Cl.
CPC ...... *H01L 25/0657* (2013.01); *H01L 23/3157* (2013.01); *H01L 23/49541* (2013.01);
(Continued)

(58) Field of Classification Search
CPC . H01L 25/0657; H01L 23/3157; H01L 24/96; H01L 2224/04105; H01L 2224/18
See application file for complete search history.

(56) References Cited

U.S. PATENT DOCUMENTS 3,639,888 A    2/1972 Pittman et al.
4,323,914 A    4/1982 Berndlmaier et al.
(Continued)

FOREIGN PATENT DOCUMENTS

CN    2512114 Y    9/2002
CN    1531069 A    9/2004
(Continued)

OTHER PUBLICATIONS

International Search Report for Application No. PCT/US2016/062304 dated Mar. 6, 2017.
(Continued)

*Primary Examiner* — Nathan W Ha
(74) *Attorney, Agent, or Firm* — Lerner, David, Littenberg, Krumholz & Mentlik, LLP

(57) ABSTRACT

A microelectronic assembly includes a stack of microelectronic elements, e.g., semiconductor chips, each having a front surface defining a respective plane of a plurality of planes. A leadframe interconnect joined to a contact at a front surface of each chip may extend to a position beyond the edge surface of the respective microelectronic element. The chip stack is mounted to support element at an angle such that edge surfaces of the chips face a major surface of the support element that defines a second plane that is transverse to, i.e., not parallel to the plurality of parallel planes. The leadframe interconnects are electrically coupled at ends thereof to corresponding contacts at a surface of the support element.

13 Claims, 7 Drawing Sheets

(51) Int. Cl.
*H01L 23/00* (2006.01)
*H01L 23/31* (2006.01)

(52) U.S. Cl.
CPC .... *H01L 24/96* (2013.01); *H01L 2224/04105* (2013.01); *H01L 2224/18* (2013.01)

(56) References Cited

U.S. PATENT DOCUMENTS

| | | |
|---|---|---|
| 4,336,551 A | 6/1982 | Fujita et al. |
| 4,363,076 A | 12/1982 | McIver |
| 4,500,905 A | 2/1985 | Shibata |
| 4,706,166 A | 11/1987 | Go |
| 4,726,777 A | 2/1988 | Billman et al. |
| 4,784,972 A | 11/1988 | Hatada |
| 4,951,122 A | 8/1990 | Tsubosaki et al. |
| 4,967,262 A | 10/1990 | Farnsworth |
| 5,047,837 A | 9/1991 | Kitano et al. |
| 5,107,325 A | 4/1992 | Nakayoshi |
| 5,138,438 A | 8/1992 | Masayuki et al. |
| 5,200,362 A | 4/1993 | Lin et al. |
| 5,218,234 A | 6/1993 | Thompson et al. |
| 5,239,447 A | 8/1993 | Cotues et al. |
| 5,304,737 A | 4/1994 | Kim |
| 5,311,401 A | 5/1994 | Gates, Jr. et al. |
| 5,327,327 A | 7/1994 | Frew et al. |
| 5,331,591 A | 7/1994 | Clifton |
| 5,334,872 A | 8/1994 | Ueda et al. |
| 5,347,428 A | 9/1994 | Carson et al. |
| 5,365,106 A | 11/1994 | Watanabe |
| 5,434,745 A | 7/1995 | Shokrgozar et al. |
| 5,466,634 A | 11/1995 | Beilstein, Jr. et al. |
| 5,534,729 A | 7/1996 | Russell |
| 5,538,758 A | 7/1996 | Beach et al. |
| 5,571,754 A | 11/1996 | Bertin et al. |
| 5,592,019 A | 1/1997 | Ueda et al. |
| 5,616,953 A | 4/1997 | King et al. |
| 5,629,566 A | 5/1997 | Doi et al. |
| 5,675,180 A | 10/1997 | Pedersen et al. |
| 5,691,248 A | 11/1997 | Cronin et al. |
| 5,698,895 A | 12/1997 | Pedersen et al. |
| 5,716,759 A | 2/1998 | Badehi |
| 5,721,151 A | 2/1998 | Padmanabhan et al. |
| 5,731,631 A | 3/1998 | Yama et al. |
| 5,737,191 A | 4/1998 | Horiuchi et al. |
| 5,801,448 A | 9/1998 | Ball |
| 5,870,351 A | 2/1999 | Ladabaum et al. |
| 5,879,965 A | 3/1999 | Jiang et al. |
| 5,891,761 A | 4/1999 | Vindasius et al. |
| 5,910,687 A | 6/1999 | Chen et al. |
| 5,946,545 A | 8/1999 | Bertin et al. |
| 5,965,947 A | 10/1999 | Nam et al. |
| 6,005,776 A | 12/1999 | Holman et al. |
| 6,030,854 A | 2/2000 | Mashimoto et al. |
| 6,034,438 A | 3/2000 | Petersen |
| 6,071,139 A | 6/2000 | Corisis et al. |
| 6,087,716 A | 7/2000 | Ikeda |
| 6,088,237 A | 7/2000 | Farnworth et al. |
| 6,107,164 A | 8/2000 | Ohuchi |
| 6,175,158 B1 | 1/2001 | Degani et al. |
| 6,225,689 B1 | 5/2001 | Moden et al. |
| 6,228,686 B1 | 5/2001 | Smith et al. |
| 6,255,726 B1 | 7/2001 | Vindasius et al. |
| 6,262,476 B1 | 7/2001 | Vidal |
| 6,271,598 B1 | 8/2001 | Vindasius et al. |
| 6,297,657 B1 | 10/2001 | Thiessen et al. |
| 6,303,977 B1 | 10/2001 | Schroen et al. |
| 6,315,856 B1 | 11/2001 | Asagiri et al. |
| 6,320,253 B1 | 11/2001 | Kinsman et al. |
| 6,326,244 B1 | 12/2001 | Brooks et al. |
| 6,326,689 B1 | 12/2001 | Thomas |
| 6,338,980 B1 | 1/2002 | Satoh |
| 6,351,030 B2 | 2/2002 | Havens et al. |
| 6,418,033 B1 | 7/2002 | Rinne |
| 6,472,744 B1 | 10/2002 | Sato et al. |
| 6,472,746 B2 | 10/2002 | Taniguchi et al. |
| 6,473,291 B1 * | 10/2002 | Stevenson ............ H01G 4/228 361/301.4 |
| 6,476,467 B2 | 11/2002 | Nakamura et al. |
| 6,566,760 B1 | 5/2003 | Kawamura et al. |
| 6,569,709 B2 | 5/2003 | Derderian |
| D475,981 S | 6/2003 | Michii |
| 6,580,165 B1 | 6/2003 | Singh |
| 6,582,992 B2 | 6/2003 | Poo et al. |
| 6,593,648 B2 | 7/2003 | Emoto |
| 6,607,938 B2 | 8/2003 | Kwon et al. |
| 6,607,941 B2 | 8/2003 | Prabhu et al. |
| 6,621,155 B1 | 9/2003 | Perino et al. |
| 6,621,172 B2 | 9/2003 | Nakayama et al. |
| 6,624,505 B2 | 9/2003 | Badehi |
| 6,656,827 B1 | 12/2003 | Tsao et al. |
| 6,667,543 B1 | 12/2003 | Chow et al. |
| 6,670,701 B2 | 12/2003 | Matsuura et al. |
| 6,674,159 B1 | 1/2004 | Peterson et al. |
| 6,686,655 B2 | 2/2004 | Moden et al. |
| 6,706,971 B2 | 3/2004 | Albert et al. |
| 6,710,246 B1 | 3/2004 | Mostafazadeh et al. |
| 6,717,061 B2 | 4/2004 | Yamaguchi et al. |
| 6,722,213 B2 | 4/2004 | Offen et al. |
| 6,730,997 B2 | 5/2004 | Beyne et al. |
| 6,737,743 B2 | 5/2004 | Urakawa |
| 6,747,348 B2 | 6/2004 | Jeung et al. |
| 6,750,547 B2 | 6/2004 | Jeung et al. |
| 6,756,252 B2 | 6/2004 | Nakanishi |
| 6,777,767 B2 | 8/2004 | Badehi |
| 6,802,446 B2 | 10/2004 | Chaudhuri et al. |
| 6,844,623 B1 | 1/2005 | Peterson et al. |
| 6,849,802 B2 | 2/2005 | Song et al. |
| 6,853,557 B1 | 2/2005 | Haba et al. |
| 6,908,784 B1 | 6/2005 | Farnworth et al. |
| 6,910,268 B2 | 6/2005 | Miller |
| 6,940,022 B1 | 9/2005 | Vinciarelli et al. |
| 6,956,283 B1 | 10/2005 | Peterson |
| 6,964,915 B2 | 11/2005 | Farnworth et al. |
| 6,972,480 B2 | 12/2005 | Zilber et al. |
| 6,973,718 B2 | 12/2005 | Sheppard, Jr. et al. |
| 6,984,885 B1 | 1/2006 | Harada et al. |
| 7,005,324 B2 | 2/2006 | Imai |
| 7,029,949 B2 | 4/2006 | Farnworth et al. |
| 7,061,125 B2 | 6/2006 | Cho et al. |
| 7,115,986 B2 | 10/2006 | Moon et al. |
| 7,125,750 B2 | 10/2006 | Kwan et al. |
| 7,127,807 B2 | 10/2006 | Yamaguchi et al. |
| 7,180,168 B2 | 2/2007 | Imai |
| 7,190,060 B1 | 3/2007 | Chiang |
| 7,196,262 B2 | 3/2007 | Gronet |
| 7,208,335 B2 | 4/2007 | Boon et al. |
| 7,208,345 B2 | 4/2007 | Meyer et al. |
| 7,215,018 B2 | 5/2007 | Vindasius et al. |
| 7,221,051 B2 | 5/2007 | Ono et al. |
| 7,245,021 B2 | 7/2007 | Vindasius et al. |
| 7,259,455 B2 | 8/2007 | Seto |
| 7,279,363 B2 | 10/2007 | Cherukuri et al. |
| 7,285,865 B2 | 10/2007 | Kwon et al. |
| 7,335,533 B2 | 2/2008 | Derderian |
| 7,344,917 B2 | 3/2008 | Gautham |
| 7,355,274 B2 | 4/2008 | Lim |
| 7,402,911 B2 | 7/2008 | Thomas et al. |
| 7,405,138 B2 | 7/2008 | Ohuchi et al. |
| 7,408,243 B2 | 8/2008 | Shifter |
| 7,429,782 B2 | 9/2008 | Brunnbauer et al. |
| 7,452,743 B2 | 11/2008 | Oliver et al. |
| 7,514,350 B2 | 4/2009 | Hashimoto |
| 7,521,288 B2 | 4/2009 | Arai et al. |
| 7,535,109 B2 | 5/2009 | Robinson et al. |
| 7,564,142 B2 | 7/2009 | Hashimoto |
| 7,595,222 B2 | 9/2009 | Shimoishizaka et al. |
| 7,601,039 B2 | 10/2009 | Eldridge et al. |
| 7,638,869 B2 | 12/2009 | Irsigler et al. |
| 7,662,670 B2 | 2/2010 | Noma et al. |
| 7,662,671 B2 | 2/2010 | Saeki |
| 7,704,794 B2 | 4/2010 | Mess et al. |
| 7,732,912 B2 | 6/2010 | Damberg |
| 7,768,795 B2 | 8/2010 | Sakurai et al. |
| 7,829,438 B2 | 11/2010 | Haba et al. |

(56) References Cited

U.S. PATENT DOCUMENTS

| | | |
|---|---|---|
| 7,863,159 B2 | 1/2011 | Co et al. |
| 7,888,185 B2 | 2/2011 | Corisis et al. |
| 7,901,989 B2 | 3/2011 | Haba et al. |
| 7,919,846 B2 | 4/2011 | Hembree |
| 7,923,349 B2 | 4/2011 | McElrea et al. |
| 7,951,649 B2 | 5/2011 | Val |
| 7,952,195 B2 | 5/2011 | Haba |
| 8,022,527 B2 | 9/2011 | Haba et al. |
| 8,040,682 B2 | 10/2011 | Shimoda |
| 8,076,788 B2 | 12/2011 | Haba et al. |
| 8,178,978 B2 | 5/2012 | McElrea et al. |
| 8,373,280 B2 | 2/2013 | Harada et al. |
| 8,390,109 B2 | 3/2013 | Popovic et al. |
| 8,431,435 B2 | 4/2013 | Haba et al. |
| 8,551,815 B2 | 10/2013 | Avsian et al. |
| 8,618,659 B2 | 12/2013 | Sato et al. |
| 8,619,659 B2 | 12/2013 | Lee et al. |
| 8,629,543 B2 | 1/2014 | McElrea et al. |
| 8,633,576 B2 | 1/2014 | Zohni et al. |
| 8,674,482 B2 | 3/2014 | Shi et al. |
| 8,704,379 B2 | 4/2014 | Crane et al. |
| 8,723,332 B2 | 5/2014 | McElrea et al. |
| 8,772,920 B2 | 7/2014 | Thacker et al. |
| 8,952,514 B2 | 2/2015 | Chun |
| 9,123,418 B2 | 9/2015 | Lin et al. |
| 9,136,251 B2 | 9/2015 | Cheah et al. |
| 9,490,195 B1 | 11/2016 | Prabhu et al. |
| 9,508,691 B1 | 11/2016 | Delacruz et al. |
| 2001/0012725 A1 | 8/2001 | Maeda et al. |
| 2001/0031548 A1 | 10/2001 | Elenius et al. |
| 2002/0006686 A1 | 1/2002 | Cloud et al. |
| 2002/0027257 A1 | 3/2002 | Kinsman et al. |
| 2002/0045290 A1 | 4/2002 | Ball |
| 2002/0096349 A1 | 7/2002 | Hedler et al. |
| 2002/0127775 A1 | 9/2002 | Haba et al. |
| 2002/0168798 A1 | 11/2002 | Glenn et al. |
| 2002/0180010 A1 | 12/2002 | Tsubosaki et al. |
| 2002/0185725 A1 | 12/2002 | Moden et al. |
| 2002/0187260 A1 | 12/2002 | Sheppard et al. |
| 2002/0190368 A1 | 12/2002 | Shimoe et al. |
| 2003/0038353 A1 | 2/2003 | Derderian |
| 2003/0038356 A1 | 2/2003 | Derderian |
| 2003/0038357 A1 | 2/2003 | Derderian |
| 2003/0060034 A1 | 3/2003 | Beyne et al. |
| 2003/0071338 A1 | 4/2003 | Jeung et al. |
| 2003/0071341 A1 | 4/2003 | Jeung et al. |
| 2003/0080403 A1 | 5/2003 | Jeung et al. |
| 2003/0092326 A1 | 5/2003 | Nishikawa et al. |
| 2003/0096454 A1 | 5/2003 | Poo et al. |
| 2003/0099085 A1 | 5/2003 | Duva |
| 2003/0122243 A1 | 7/2003 | Lee et al. |
| 2003/0143819 A1 | 7/2003 | Hedler et al. |
| 2003/0148597 A1 | 8/2003 | Tan et al. |
| 2003/0162369 A1 | 8/2003 | Kobayashi |
| 2003/0209772 A1 | 11/2003 | Prabhu |
| 2004/0113283 A1 | 6/2004 | Farnworth et al. |
| 2004/0142509 A1 | 7/2004 | Imai |
| 2004/0150095 A1 | 8/2004 | Fraley et al. |
| 2004/0173892 A1 | 9/2004 | Nakanishi |
| 2004/0195667 A1 | 10/2004 | Kamezos |
| 2004/0198033 A1 | 10/2004 | Lee et al. |
| 2004/0212083 A1 | 10/2004 | Yang |
| 2004/0217446 A1 | 11/2004 | Headley et al. |
| 2004/0227235 A1 | 11/2004 | Hashimoto |
| 2004/0238933 A1 | 12/2004 | Chen et al. |
| 2004/0251520 A1 | 12/2004 | Sasaki et al. |
| 2004/0262035 A1 | 12/2004 | Ko et al. |
| 2005/0013927 A1 | 1/2005 | Yamazaki |
| 2005/0067680 A1 | 3/2005 | Boon et al. |
| 2005/0067694 A1 | 3/2005 | Pon et al. |
| 2005/0082651 A1 | 4/2005 | Farnworth et al. |
| 2005/0085050 A1 | 4/2005 | Draney et al. |
| 2005/0101039 A1 | 5/2005 | Chen et al. |
| 2005/0104179 A1 | 5/2005 | Zilber et al. |
| 2005/0121758 A1* | 6/2005 | Di Stefano ............ H01L 24/72 257/678 |
| 2005/0135067 A1 | 6/2005 | Park et al. |
| 2005/0148160 A1 | 7/2005 | Farnworth et al. |
| 2005/0156323 A1 | 7/2005 | Tokunaga |
| 2005/0230802 A1 | 10/2005 | Vindasius et al. |
| 2005/0248021 A1 | 11/2005 | Morkner |
| 2005/0258530 A1 | 11/2005 | Vindasius et al. |
| 2005/0287705 A1 | 12/2005 | Yang |
| 2005/0287709 A1 | 12/2005 | Lee et al. |
| 2006/0003552 A1 | 1/2006 | Okada |
| 2006/0035408 A1 | 2/2006 | Derderian |
| 2006/0046436 A1 | 3/2006 | Ohuchi et al. |
| 2006/0055050 A1 | 3/2006 | Numata et al. |
| 2006/0068567 A1 | 3/2006 | Beyne et al. |
| 2006/0076690 A1 | 4/2006 | Khandros et al. |
| 2006/0094165 A1 | 5/2006 | Hedler et al. |
| 2006/0097356 A1 | 5/2006 | Fujii et al. |
| 2006/0103000 A1 | 5/2006 | Kurosawa |
| 2006/0121645 A1 | 6/2006 | Ball |
| 2006/0138626 A1 | 6/2006 | Liew et al. |
| 2006/0220262 A1 | 10/2006 | Meyer et al. |
| 2006/0233012 A1 | 10/2006 | Sekiguchi et al. |
| 2006/0252180 A1 | 11/2006 | Moden et al. |
| 2006/0267173 A1 | 11/2006 | Takiar et al. |
| 2006/0273365 A1 | 12/2006 | Cross et al. |
| 2006/0278971 A1 | 12/2006 | Barnes et al. |
| 2007/0023900 A1 | 2/2007 | Toyoda |
| 2007/0029684 A1 | 2/2007 | Arai et al. |
| 2007/0065987 A1 | 3/2007 | Mess et al. |
| 2007/0102801 A1 | 5/2007 | Ishida et al. |
| 2007/0132082 A1 | 6/2007 | Tang et al. |
| 2007/0158799 A1 | 7/2007 | Chiu et al. |
| 2007/0158807 A1 | 7/2007 | Lu et al. |
| 2007/0170572 A1 | 7/2007 | Liu et al. |
| 2007/0181989 A1 | 8/2007 | Corisis et al. |
| 2007/0187811 A1 | 8/2007 | Arai et al. |
| 2007/0194462 A1 | 8/2007 | Kim et al. |
| 2007/0222054 A1 | 9/2007 | Hembree |
| 2007/0252262 A1 | 11/2007 | Robinson et al. |
| 2007/0284716 A1 | 12/2007 | Vindasius et al. |
| 2007/0290333 A1* | 12/2007 | Saini ..................... G11C 5/02 257/723 |
| 2008/0029866 A1 | 2/2008 | Kim et al. |
| 2008/0029884 A1 | 2/2008 | Grafe et al. |
| 2008/0083976 A1 | 4/2008 | Haba et al. |
| 2008/0083977 A1 | 4/2008 | Haba et al. |
| 2008/0094086 A1 | 4/2008 | Kim |
| 2008/0112150 A1 | 5/2008 | Jones |
| 2008/0150158 A1 | 6/2008 | Chin |
| 2008/0166836 A1 | 7/2008 | Jobetto |
| 2008/0173792 A1 | 7/2008 | Yang et al. |
| 2008/0180242 A1 | 7/2008 | Cottingham |
| 2008/0203566 A1 | 8/2008 | Su |
| 2008/0206915 A1 | 8/2008 | Yamazaki |
| 2008/0208043 A1 | 8/2008 | Smith et al. |
| 2008/0251913 A1 | 10/2008 | Inomata |
| 2008/0251939 A1 | 10/2008 | Chung et al. |
| 2008/0284044 A1 | 11/2008 | Myers |
| 2008/0290493 A1 | 11/2008 | Tsunozaki |
| 2008/0303131 A1 | 12/2008 | McElrea et al. |
| 2008/0308921 A1 | 12/2008 | Kim |
| 2008/0315407 A1 | 12/2008 | Andrews, Jr. et al. |
| 2009/0020887 A1 | 1/2009 | Mizuno et al. |
| 2009/0020889 A1 | 1/2009 | Murayama et al. |
| 2009/0045524 A1 | 2/2009 | Mohammed et al. |
| 2009/0065948 A1 | 3/2009 | Wang |
| 2009/0068790 A1 | 3/2009 | Caskey et al. |
| 2009/0102038 A1 | 4/2009 | McElrea et al. |
| 2009/0127689 A1 | 5/2009 | Ye et al. |
| 2009/0146137 A1 | 6/2009 | Kim et al. |
| 2009/0160065 A1 | 6/2009 | Haba et al. |
| 2009/0209061 A1 | 8/2009 | Jeong |
| 2009/0212410 A1 | 8/2009 | Wu et al. |
| 2009/0230528 A1 | 9/2009 | McElrea et al. |
| 2009/0316378 A1 | 12/2009 | Haba et al. |
| 2010/0140753 A1 | 6/2010 | Hembree |
| 2010/0140811 A1 | 6/2010 | Leal et al. |
| 2010/0148352 A1 | 6/2010 | Moden |

(56) References Cited

U.S. PATENT DOCUMENTS

| | | |
|---|---|---|
| 2010/0207277 A1 | 8/2010 | Bauer et al. |
| 2010/0327461 A1 | 12/2010 | Co et al. |
| 2011/0006432 A1 | 1/2011 | Haba et al. |
| 2011/0031629 A1 | 2/2011 | Haba et al. |
| 2011/0033979 A1 | 2/2011 | Haba et al. |
| 2011/0049696 A1 | 3/2011 | Haba et al. |
| 2011/0169154 A1 | 7/2011 | Kweon et al. |
| 2011/0187007 A1 | 8/2011 | Haba et al. |
| 2011/0248410 A1 | 10/2011 | Avsian et al. |
| 2011/0266684 A1 | 11/2011 | Leal |
| 2012/0025396 A1 | 2/2012 | Liao et al. |
| 2012/0049376 A1 | 3/2012 | Harada et al. |
| 2012/0051695 A1 | 3/2012 | Harada et al. |
| 2012/0056327 A1 | 3/2012 | Harada et al. |
| 2012/0061846 A1 | 3/2012 | Rathburn |
| 2012/0080807 A1 | 4/2012 | Haba et al. |
| 2012/0133057 A1 | 5/2012 | Haba et al. |
| 2012/0211878 A1 | 8/2012 | Popovic et al. |
| 2012/0280386 A1 | 11/2012 | Sato et al. |
| 2012/0313264 A1 | 12/2012 | Sato et al. |
| 2013/0083583 A1 | 4/2013 | Crisp et al. |
| 2013/0099392 A1 | 4/2013 | McElrea et al. |
| 2013/0099393 A1 | 4/2013 | Jeong et al. |
| 2013/0119542 A1 | 5/2013 | Oh |
| 2013/0154117 A1 | 6/2013 | Tan et al. |
| 2013/0286707 A1 | 10/2013 | Crisp et al. |
| 2013/0299977 A1 | 11/2013 | Dayringer et al. |
| 2013/0336039 A1 | 12/2013 | Frans |
| 2013/0341803 A1 | 12/2013 | Cheah et al. |
| 2014/0070423 A1 | 3/2014 | Woychik et al. |
| 2014/0097526 A1 | 4/2014 | Suleiman et al. |
| 2014/0104786 A1 | 4/2014 | Clayton et al. |
| 2014/0264945 A1 | 9/2014 | Yap et al. |
| 2015/0098677 A1 | 4/2015 | Thacker et al. |
| 2015/0200181 A1 | 7/2015 | Haga et al. |
| 2016/0035698 A1 | 2/2016 | Lee et al. |
| 2016/0141232 A1 | 5/2016 | Cannon |
| 2017/0018485 A1 | 1/2017 | Prabhu et al. |

FOREIGN PATENT DOCUMENTS

| | | |
|---|---|---|
| CN | 1638118 A | 7/2005 |
| CN | 1905148 A | 1/2007 |
| CN | 104332462 A | 2/2015 |
| DE | 102004039906 A1 | 8/2005 |
| EP | 1041624 A1 | 10/2000 |
| EP | 1763894 A2 | 3/2007 |
| EP | 2650880 A1 | 10/2013 |
| FR | 2704690 A1 | 11/1994 |
| JP | 07-509104 A | 10/1995 |
| JP | 11-260851 A | 9/1999 |
| JP | 2000269411 A | 9/2000 |
| JP | 2001210782 A | 8/2001 |
| JP | 2003-142518 A | 5/2003 |
| JP | 2003163324 A | 6/2003 |
| JP | 2004047702 A | 2/2004 |
| JP | 2004-119473 | 4/2004 |
| JP | 2004153130 A | 5/2004 |
| JP | 2004158536 A | 6/2004 |
| JP | 2004-214548 A | 7/2004 |
| JP | 2005005529 A | 1/2005 |
| JP | 2005026564 A | 1/2005 |
| JP | 2006-351793 A | 12/2006 |
| JP | 2007073803 A | 3/2007 |
| JP | 2007523482 A | 8/2007 |
| JP | 2008160119 A | 7/2008 |
| JP | 2008205453 A | 9/2008 |
| JP | 2008236688 A | 10/2008 |
| JP | 2009-026969 | 2/2009 |
| JP | 2009027039 A | 2/2009 |
| KR | 20-1994-0004952 | 7/1994 |
| KR | 10-1999-0008537 | 2/1999 |
| KR | 20010062722 A | 7/2001 |
| KR | 20050009036 A | 1/2005 |
| KR | 20070018057 A | 2/2007 |
| KR | 100813624 B1 | 3/2008 |
| KR | 20080045259 A | 5/2008 |
| KR | 20080069549 A | 7/2008 |
| KR | 20080091980 | 10/2008 |
| KR | 20140086417 A | 7/2014 |
| TW | 475244 | 2/2002 |
| TW | 200425356 A | 11/2004 |
| TW | 200504995 A | 2/2005 |
| TW | 200527549 A | 8/2005 |
| TW | 200605298 A | 2/2006 |
| TW | 200721471 | 6/2007 |
| TW | 200913208 A | 3/2009 |
| TW | 200940570 A | 10/2009 |
| WO | 9425987 A1 | 11/1994 |
| WO | 9907015 A1 | 2/1999 |
| WO | 9909599 A2 | 2/1999 |
| WO | 0164344 A2 | 9/2001 |
| WO | 2005081315 A2 | 9/2005 |
| WO | 2005101492 A2 | 10/2005 |
| WO | 2009032371 A1 | 3/2009 |
| WO | 2009052150 A1 | 4/2009 |
| WO | 2009114670 A2 | 9/2009 |
| WO | 2010057339 A1 | 5/2010 |

OTHER PUBLICATIONS

International Search Report for Application No. PCT/US2017/026444 dated Jul. 21, 2017.
Cheah, Bok Eng, et al., Modeling and Electrical Characteristics Evaluation of Vertical Side-Chip Internconnection for Compact 3D Integration, School of Electrical and Electronic Engineering, Universiti Sains Malaysia, 13th Electronics Materials and Packaging (EMAP), Nov. 2011, 7 pages.
Han, Sang Wook, Wireless Interconnect using Inductive Coupling in 3D-ICs, University of Michigan, 2012, 133 pages.
Kong, J., et al., Sensitivity Study of Channel Termination on Vertical Side-Chip Interconnection, Universiti Sains Malaysia, 35th International Electronic Manufacturing Technology Conference, 2012, 6 pages.
U.S. Appl. No. 14/883,864, dated Oct. 15, 2015.

* cited by examiner

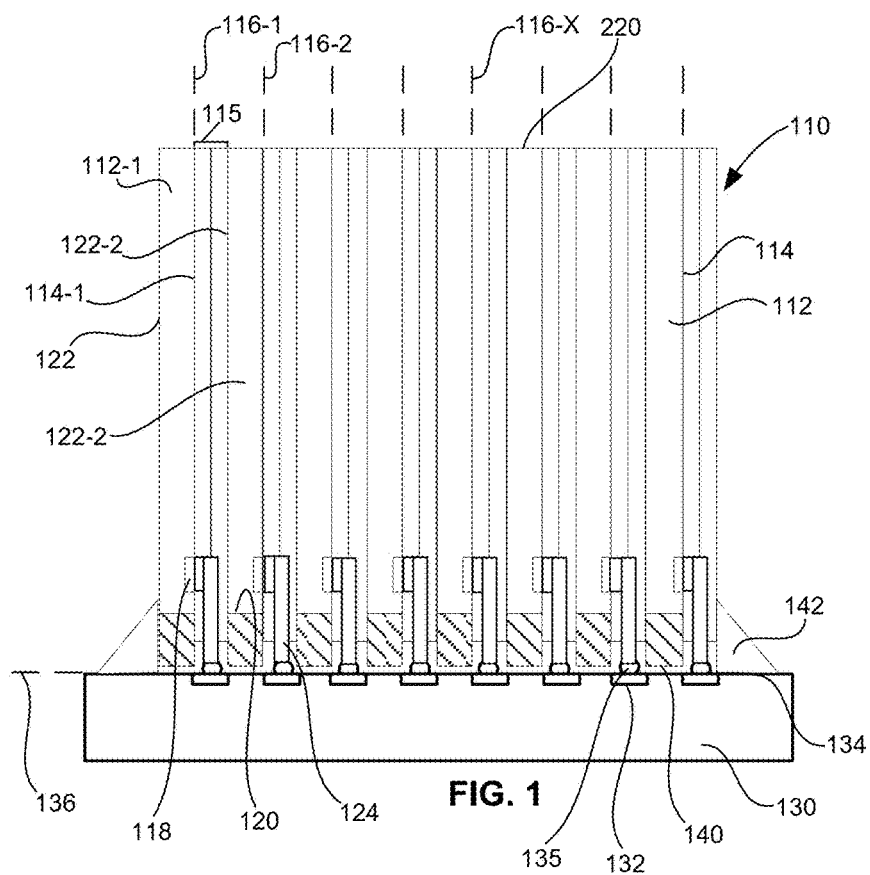
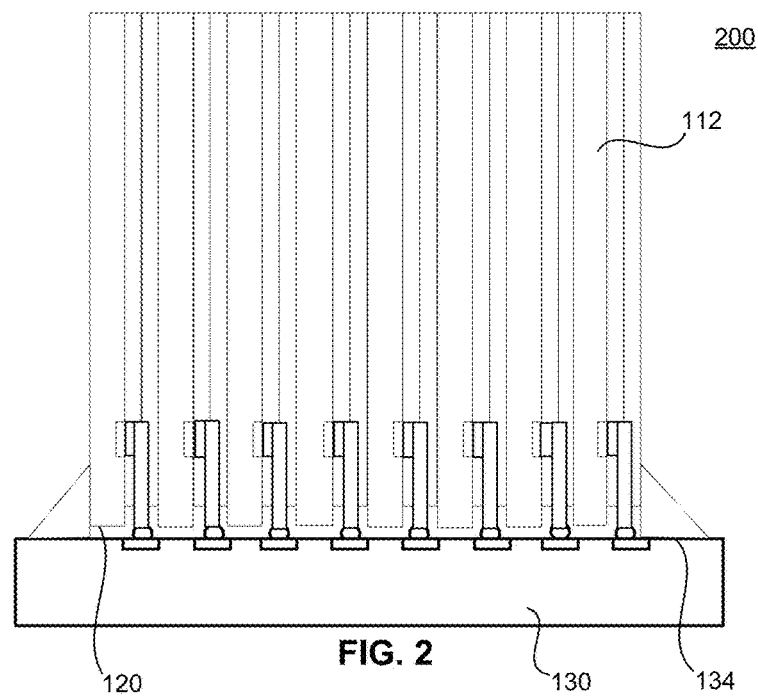

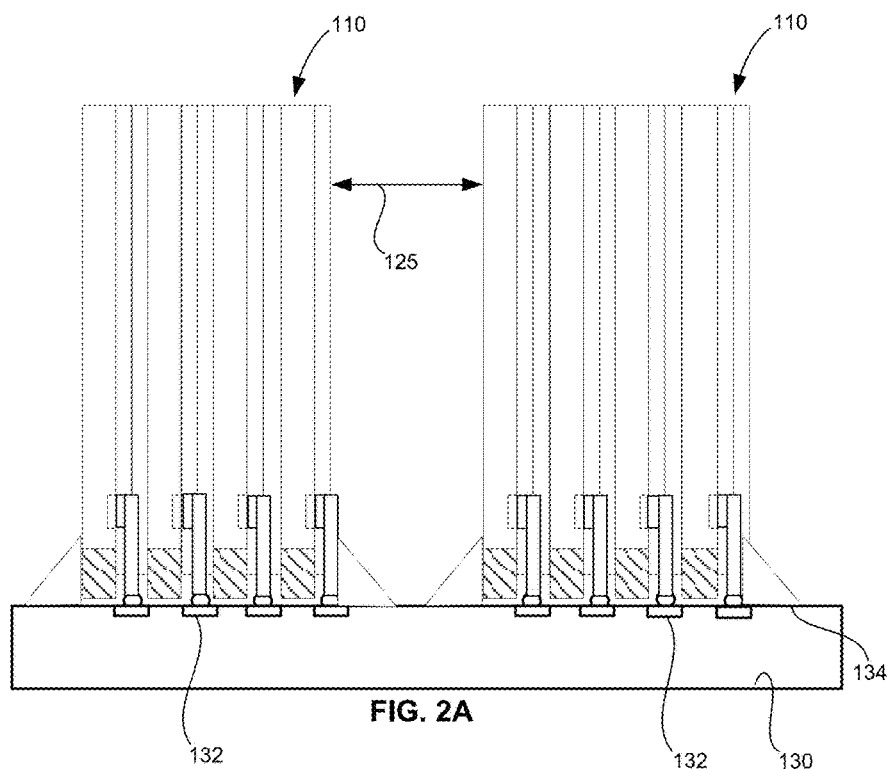

FLIPPED DIE STACK ASSEMBLIES WITH LEADFRAME INTERCONNECTS

CROSS-REFERENCE TO RELATED APPLICATION

This application claims the benefit of the filing date of U.S. Provisional Application No. 62/194,051 filed Jul. 17, 2015 and 62/219,015 filed Sep. 15, 2015, the disclosures of which are incorporated by reference herein.

BACKGROUND OF THE INVENTION

Field of the Invention

The subject matter of this application relates to microelectronic packages and assemblies in which a plurality of semiconductor chips are stacked one above the other and electrically interconnected with a substrate such as a package element or other circuit panel.

Description of the Related Art

Semiconductor die or chips are flat bodies with contacts disposed on the front surface that are connected to the internal electrical circuitry of the chip itself. Semiconductor chips are typically packaged with substrates to form microelectronic packages having terminals that are electrically connected to the chip contacts. The package may then be connected to test equipment to determine whether the packaged device conforms to a desired performance standard. Once tested, the package may be connected to a larger circuit, e.g., a circuit in an electronic product such as a computer or a cell phone.

Microelectronic packages can include wafer level packages, which provide a package for a semiconductor component that is fabricated while the chips are still in a wafer form. The wafer is subjected to a number of additional process steps to form the package structure and the wafer is then diced to free the individual die or chips. Wafer level processing may provide a cost savings advantage. Furthermore, fan-out wafer-level packages can be fabricated by encapsulating edges of an array of semiconductor chips within a reconstituted wafer, and then performing additional processing to form fan-out traces and contacts.

In order to save space certain conventional designs have stacked multiple microelectronic elements or semiconductor chips within a package. This allows the package to occupy a surface area on a substrate that is less than the total surface area of the chips in the stack. However, conventional stacked packages have disadvantages of complexity, cost, thickness and testability.

In spite of the above advances, there remains a need for improved stacked packages and especially stacked chip packages which incorporate multiple chips for certain types of memory, e.g., flash memory. There is a need for such packages which are reliable, thin, testable and that are economical to manufacture.

BRIEF DESCRIPTION OF THE SEVERAL VIEWS OF THE DRAWING

FIG. 1 is a sectional view depicting a microelectronic assembly in accordance with an embodiment of the invention.

FIG. 2 is a sectional view depicting a microelectronic assembly in accordance with an embodiment of the invention.

FIG. 2A is a sectional view depicting a microelectronic assembly in accordance with a variation of an embodiment of the invention depicted in FIG. 1 or FIG. 2.

DETAILED DESCRIPTION OF THE INVENTION

Figure 3:
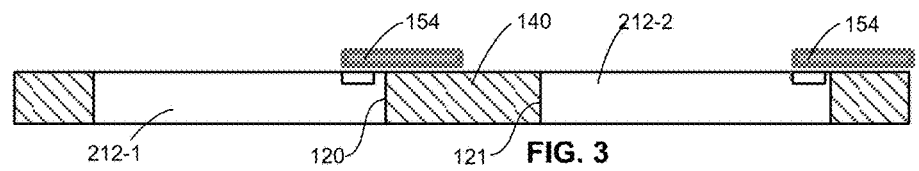
FIG. 3 is a sectional view depicting an in-process element in accordance with a fabrication method according to an embodiment of the invention.

A microelectronic assembly may include a stack of microelectronic elements, e.g., semiconductor chips, each having a front surface defining a respective plane of a plurality of planes. A leadframe interconnect joined to a contact at a front surface of each chip may extend to a position beyond the edge surface of the respective microelectronic element. The chip stack is mounted to support element at an angle such that edge surfaces of the chips face a major surface of the support element that defines a second plane that is transverse to, i.e., not parallel to the plurality of parallel planes. The leadframe interconnects are electrically coupled at ends thereof to corresponding contacts at a surface of the support element.

A method of fabricating a microelectronic assembly may include forming individual chip stacks each chip stack comprising a plurality of microelectronic elements stacked one above another microelectronic element such that front surfaces of the respective microelectronic elements define respective planes of a plurality of planes. Each microelectronic element may have a plurality of contacts at the front surface, and an edge surface extending away from the respective front surface, a dielectric region on the edge surface of the respective microelectronic element. A plurality of leadframe interconnects may each electrically coupled to a contact of one of the microelectronic elements. Each leadframe interconnect may have an end at a remote surface of the dielectric region of the respective microelectronic element. Then, the ends of the leadframe interconnects may each be joined with a corresponding electrically conductive support contact at a major surface of a support element, such that the ends face the support contacts, wherein the major surface defines a second plane non-parallel with the plurality of parallel planes. The chip stack may be mounted to the support element with the remote surfaces of the dielectric regions facing towards the major surface.

A method of fabricating a microelectronic assembly may include forming a plurality of subassemblies, each subassembly formed by aligning and joining leads of a molded leadframe to contacts of a plurality of individual microelectronic elements, and forming a dielectric region mechanically reinforcing connections between the microelectronic elements and the molded leadframe. Then, the subassemblies may be stacked one above the other, and the stacked subassemblies can be processed into individual chip stacks in which the front surface of each microelectronic element defines a plane of a plurality of respective parallel planes, the processing defining remote surfaces of the dielectric regions which are remote from the edge surfaces of the respective microelectronic elements. The processing may define the ends of leadframe interconnects at the remote surfaces. The method may include joining the ends of the leadframe interconnects with a corresponding electrically conductive contact at a major surface of a support element such that the ends of the leadframe interconnects face the contacts of the support element. The major surface may define a second plane non-parallel with the plurality of parallel planes, and the chip stack may be mounted to the support element with the remote surfaces of the dielectric regions facing towards the major surface.

As used in this disclosure with reference to a dielectric region or a dielectric structure of a component, e.g., circuit structure, interposer, microelectronic element, capacitor, voltage regulator, circuit panel, substrate, etc., a statement that an electrically conductive element is "at" a surface of the dielectric region or component indicates that, when the surface is not covered or assembled with any other element, the electrically conductive element is available for contact with a theoretical point moving in a direction perpendicular to that surface of the dielectric region from outside the dielectric region or component. Thus, a terminal or other conductive element which is at a surface of a dielectric region may project from such surface; may be flush with such surface; or may be recessed relative to such surface in a hole or depression in the dielectric region.

FIG. 1 illustrates a microelectronic assembly in accordance with an embodiment of the invention. As seen in FIG. 1, microelectronic assembly 100 includes a chip stack 110 which includes a plurality of stacked microelectronic elements 112 such as semiconductor chips or semiconductor chips having additional circuitry on a face thereof. In one example, each of the semiconductor chips may include one or more memory storage arrays, which may include a particular memory type such as nonvolatile memory. Nonvolatile memory can be implemented in a variety of technologies some of which include memory cells that incorporate floating gates, such as, for example, flash memory, and others which include memory cells which operate based on magnetic polarities. Flash memory chips are currently in widespread use as solid state storage as an alternative to magnetic fixed disk drives for computing and mobile devices. Flash memory chips are also commonly used in portable and readily interchangeable memory drives and cards, such as Universal Serial Bus (USB) memory drives, and memory cards such as Secure Digital or SD cards, microSD cards (trademarks or registered trademarks of SD-3C) and the like. Flash memory chips typically have NAND or NOR type devices therein; NAND type devices are common. Other examples of microelectronic elements 112 may also include one or more DRAM, NOR, microprocessor, controller die, etc. Each semiconductor chip may be implemented in one of various semiconductor materials such as silicon, germanium, gallium arsenide or other Groups III-V or Groups II-VI semiconductor compound, etc.

Each microelectronic element has a front surface 114 defining a respective plane 116-x of a plurality of planes 116-1, 116-2, etc. Each microelectronic element has a plurality of contacts 118 at its front surface and an edge surface 120 which extends away from the front surface of such chip. Each chip also has a rear surface 122 opposite from its front surface 114.

Although the front surfaces of each of the chips in the chip stack are shown all oriented in the same direction in FIG. 1, the front surfaces of one or more of the chips in the stack can be oriented in the opposite direction such that the front surfaces of at least two of the chips which are adjacent one another would either face each other or would face in opposite directions away from one another.

In the example seen in FIG. 1, the chip stack 110 may include a dielectric region 115 that extends between the front surface 114-1 of a first chip 112-1 and a front surface or a rear surface 122-2 of a second chip 112-2 that is adjacent to the first chip in the chip stack. Such dielectric regions are disposed between adjacent surfaces of other chips in the chip stack depicted in FIG. 1. The dielectric region may include one or more adhesive layers or other dielectric material. Typically, the dielectric region includes at least adhesive layers coupled to each of the opposed front or rear surfaces of adjacent chips in the chip stack. In one embodiment, the dielectric region includes one or more layers of polyimide or other polymeric material.

The chip stack also includes a plurality of metal leadframe interconnects 124 each coupled with a contact 118 on one of the chips and which extends in a direction generally parallel to the front surface 114 towards an edge surface 120 of the respective chip.

As depicted in FIG. 1, each of the leadframe interconnects may extend from a contact 118 that is disposed adjacent an edge surface 120 which faces a major surface 134 of a support element 130 such as a substrate. The support element 130 can be formed of various materials, which may or may not include a polymeric component, and may or may not include an inorganic component, or alternatively may be wholly or essentially polymeric or may be wholly or essentially inorganic. In various non-limiting examples, the support element can be formed of a composite material such as glass-reinforced epoxy, e.g., FR-4, a semiconductor material, e.g., Si or GaAs, or glass or ceramic material. The chip terminals may be elongated in a direction extending towards the edge surface 120. In some cases, all the chip terminals can extend from contacts 118 to locations adjacent to, or beyond only the edge surfaces 120 which face the major surface 134 of the support element.

As seen in FIG. 1, electrically conductive material 135 such as conductive masses, conductive pillars, stud bumps or other suitable electrically conductive material may be used to electrically connect each of the leadframe interconnects 124 at an end thereof to a corresponding substrate contact 132. Here, the conductive material 135 can be in form of electrically conductive bumps such as masses of solder, tin, indium or eutectic material, or drops or droplets of electrically conductive polymer material or electrically conductive ink on surfaces of the substrate contacts and contacting the leadframe interconnects terminals 124.

The electrically conductive material may be applied thereto through a transfer mold of solder bumps, balls or features, or application of solder balls, for example, or may alternatively be deposited on the substrate contacts by plating or depositing a metal or other conductive material. Alternatively, the electrically conductive material 135 can be applied by depositing an electrically conductive ink or an electrically conductive polymer material onto an exposed surface of the substrate contact 132.

In another example, chip terminals 124 can be lead portions of a leadframe which may be electrically connected to contacts 118 by electrically conductive bumps such as masses of solder, tin, indium or eutectic material, or drops or droplets of electrically conductive polymer material or electrically conductive ink, the lead portions severed from the leadframe before forming connections with the support element. Such lead portions may alternatively be coupled to contacts 118 of a chip through electrically conductive traces or pads of a redistribution layer coupled with the contacts 118.

Support element 130 may be organic substrate or semi-conducting materials like Si, GaAs, etc. As seen in FIG. 1, the parallel planes 116-$x$ defined by the front surfaces of the chips 114 are oriented transverse to, i.e., in a direction non-parallel to, a plane 136 defined by the major surface 134 of the support element.

In the example shown in FIG. 1, a dielectric region 140 which in some cases may be made of or include an encapsulant material, overlies an edge surface 120 of a respective chip. Each chip may have such dielectric region overlying the edge surface thereof. In an example, the dielectric region 140 may be or may include a molded dielectric region. In one example, the dielectric region may comprise a polymeric dielectric material, or alternatively a polymeric dielectric material with a filler therein which may have a lower coefficient of thermal expansion than the polymeric material. In some examples, the filler may include particles, flakes or a mesh or scaffold of an inorganic material such as a glass, quartz, ceramic or semiconductor material, among others.

As illustrated in FIG. 1, the parallel planes 116-$x$ may be oriented in a direction orthogonal to the plane 136 of the support element major surface. FIG. 1 shows an example in which the major surface of the support element faces the edge surfaces 120 of each chip. An adhesive 142, which may be an underfill, may be applied surrounding the electrical connections between the leadframe interconnects and the substrate contacts and the adhesive may have a function to mechanically reinforce or stiffen such electrical connections and may help the electrical connections withstand stresses due to differential thermal expansion between the chips 112 and the support element 130.

In a variation of the embodiment described above with respect to FIG. 1 (not specifically shown), each chip 112 can be disposed in an orthogonal orientation above the support element major surface 134 but without a dielectric material providing attachment between adjacent chips. In such case, the chips can be maintained in position at their mountings to the support element 130, or in some cases by other structure such as a frame coupled to the chips at one or more edge surfaces 220 which face away from the support element.

Referring to FIG. 2, in a microelectronic assembly 200 according to variation of the embodiment seen in FIG. 1, the edge surfaces 120 of the chips 112 are free from a dielectric region molded onto the edge surfaces. FIG. 2 depicts an example in which edge surfaces 120 of the chips, free of such molded dielectric region, are abutted or otherwise positioned so as to face the major surface 134 of the support element.

In one example, such as seen in FIG. 2A, a plurality of chip stacks 110 as described above relative to FIG. 1 or FIG. 2, separated from one another by a gap 125 of at least 100 microns, are each attached to respective locations of the support element 130 and electrically interconnected with respective contacts at the surface 134 of the support element.

Figure 4:
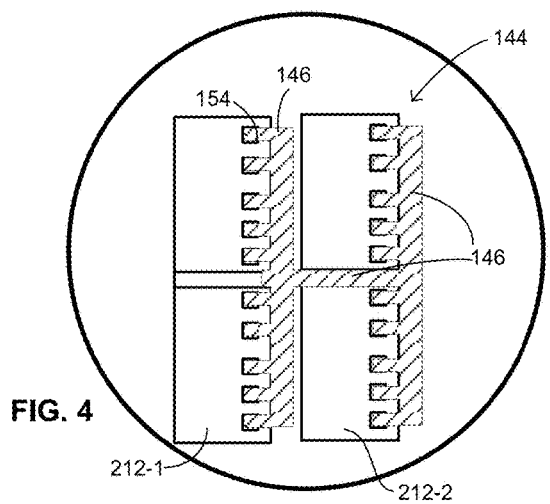
FIG. 4 is a corresponding top-down view further illustrating the in-process element depicted in FIG. 3.

Referring to FIG. 3 et seq., stages in a method of fabricating a microelectronic assembly will now be described. As seen in FIGS. 3 and 4, microelectronic elements 212-1, 212-2 which can be semiconductor chips or having additional circuitry thereon can be arranged together in positions of an array and a dielectric region 140 which may be a molded dielectric encapsulant region can be formed extending between edge surfaces 120 of each chip and adjacent edge surfaces 121 of other chips to form a reconstituted wafer 200 or panel in which the dielectric region 140 surrounds individual chips therein. In some cases, the chips may already be known to meet particular acceptance criteria, or may have been tested, and can be referred to as "known good dies". The reconstituted wafer can thus include an M×N array of such chips arranged having at least one row and a plurality of columns, i.e., M being "one or more", and N being "greater than one". In some cases, M and N may each be greater than six.

Figure 5:
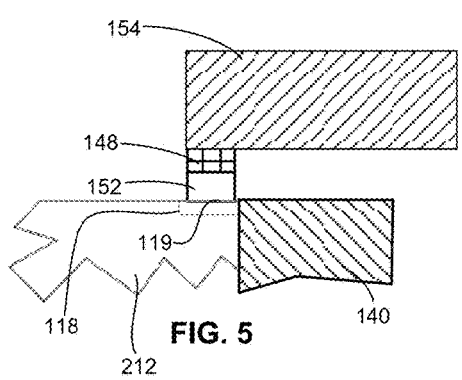
FIG. 5 is a partial fragmentary sectional view depicting an in-process element in accordance with an embodiment of the invention.

As further seen in FIGS. 4 and 5, a metal lead frame 144, is made of or consists essentially of copper, copper alloy, nickel or other suitable metal, has fingers 154 extending from support elements 146 which provide a supporting "frame". The lead frame 144 is aligned with the reconstituted wafer such that individual fingers 154 thereof are aligned with individual contacts 118 of the chip, and are then electrically connected thereto. In one example, the fingers 154 can be metallurgically joined to the contacts 118 with a bond metal, which may be one or more of tin, indium, solder or a eutectic material. In some cases, a lead frame finger 154 can be connected to or otherwise electrically coupled with more than one contact 118.

In one example, referring to FIG. 5, a lead frame finger 154 can be metallurgically joined to the contact 118 through an electrically conductive bump 152 and through an additional bond material 148. In a particular example, the bump 152 consists essentially of gold, nickel, tin or copper formed on the contact 118. The bump may in some cases by applied by using a wire bonding tool to form and bond a metal bump to a surface 119 of the contact, such as by extending a portion of wire beyond an end surface of the wire bonding tool, heating the extended portion to form a ball-like shape, and then using the wire bonding tool to apply heat and/or pressure metallurgically bond such ball to the contact.

In another example thereof, the bump 152 may be a metal superstructure which extends above a surface 119 of the original contact of the chip. Superstructures, which are formed by a process which includes plating, have areas which are defined by available open surface area of each contact 118. That is, when the entire surface area of the contact is exposed during formation of the superstructure, the superstructure occupies and contacts the entire surface area. When only a portion of the entire surface area of the contact is exposed during formation of the superstructure, the superstructure occupies and contacts that portion of the surface area which was exposed during formation of the superstructure.

The "original" contact refers to the contact of the chip as originally fabricated on the chip while still in wafer form by the semiconductor manufacturer during a semiconductor fabrication process which forms front end of line ("FEOL") and back end of line ("BEOL") circuitry including the original contacts. Thus, a bump 152 as a superstructure is formed on the surface 119 by a process subsequent to BEOL fabrication and formation of the original contacts. In one example, the superstructure can be formed on an intact wafer subsequent to the BEOL process but prior to singulation of the wafer into smaller units such as individual chips, which would then be combined in a reconstituted wafer. For example, the superstructure can be formed by depositing an electrically conductive material on each contact, such as by electroless plating or forming a sputtered metal layer (i.e., by metal vapor deposition) on each contact, then followed by electrolytic plating to build up superstructures to a height, e.g., of 5-50 microns above the surface 119 of the original contacts. In one example, the superstructures can consist essentially of at least one of copper, nickel, tin or gold.

In another example, the superstructure can be formed on the surface 119 by a process subsequent to singulation from the original wafer, and subsequent to combining the chips or units in a reconstituted wafer, such as by the above-described plating and/or sputtering examples.

Figure 6:
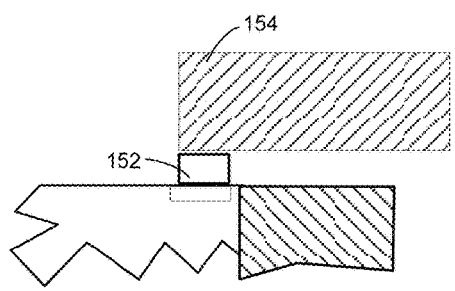
FIG. 6 is a partial fragmentary sectional view depicting an in-process element in accordance with a variation of the embodiment depicted in FIG. 5.

In yet another example, the reconstituted wafer is formed of bumped individual chips before molding. The conductive bump may be formed of solder, its composite or any other suitable metal and is partially exposed above or at the level of the encapsulation molding compound that is applied during the reconstitution process. In this example, the front surface of the chip is completely buried inside the encapsulation molding compound. In a particular example as seen in FIG. 6, the lead frame finger 154 can be bonded to the bump 152 by metal-to-metal joining. For example, when the lead frame finger 154 is made of or consists essentially of copper, a metal-to-metal bond to a copper bump 152 can be formed by application of heat and pressure between the finger 154 and the bump 152.

In a variation of the embodiment described above relative to FIGS. 3-4, the leadframe can be a molded leadframe having metal features of a leadframe such as the leadframe fingers 154 and support elements 146 integral therewith on which a dielectric region has been molded. In one example, when a molded leadframe in form of a panel or a wafer is utilized, the microelectronic elements 212 can be metallurgically joined or otherwise conductively bonded to the leadframe fingers before applying the encapsulation molding compound 140 on the panel or the wafer which contacts and encapsulates the microelectronic elements 212.

Figure 7:
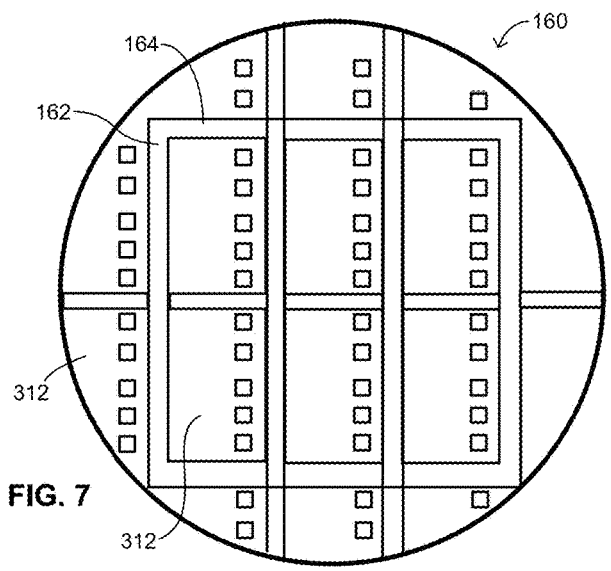
FIG. 7 is a top-down view illustrating a wafer and chips therein in accordance with a fabrication method according to an embodiment of the invention.

Referring now to FIG. 7 et seq., in a particular example, an intact wafer 160 consisting essentially of semiconductor material is shown in which the chips are provided, and semiconductor portions of the wafer between edges of the adjacent chips is shown in form of vertical dicing lanes 162 and horizontal dicing lanes 164. As used herein with respect to a top-down view of an object having a generally flat major surface such as a wafer as in FIG. 7, or a panel, subassembly or stack of subassemblies, etc., "vertical" and "horizontal" refer to orthogonal layout directions in the plane of the major surface. In another example, an intact wafer 160 may be a reconstituted wafer and the dicing lanes 162 and 164 are through a dielectric region e.g., an encapsulation molding compound that is present between the edges of the semiconductor chips or microelectronic elements.

Figure 8:
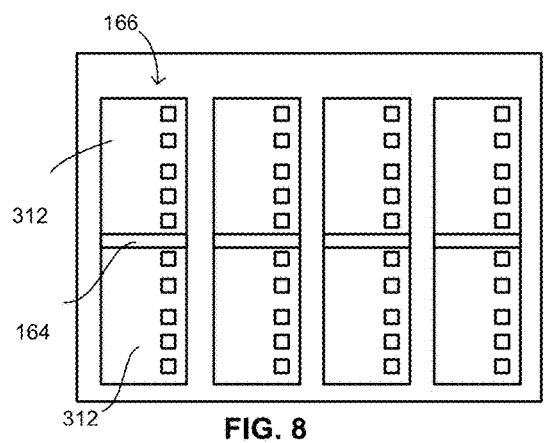
FIG. 8 is a top-down view illustrating a reconstituted panel in accordance with a fabrication method according to an embodiment of the invention.

Referring to FIG. 8, when the wafer 160 of FIG. 7 is diced, portions of the wafer 160 corresponding to the horizontal dicing lanes 164 are allowed to remain between adjacent edges of chips therein. In this way, the wafer 160 is diced into individual units 166 by cutting the wafer along the vertical dicing lanes 162, and optionally along some but not all of the horizontal dicing lanes 164. Thus, each unit comprises two or more semiconductor chips 312 and a portion of the dicing lanes 164 between adjacent edges of the chips. Although not specifically shown in FIG. 8, a unit 166 may include three, four, or any number of chips 312 which remain integral with each other through the intervening portions of the dicing lanes 164.

Figure 10:
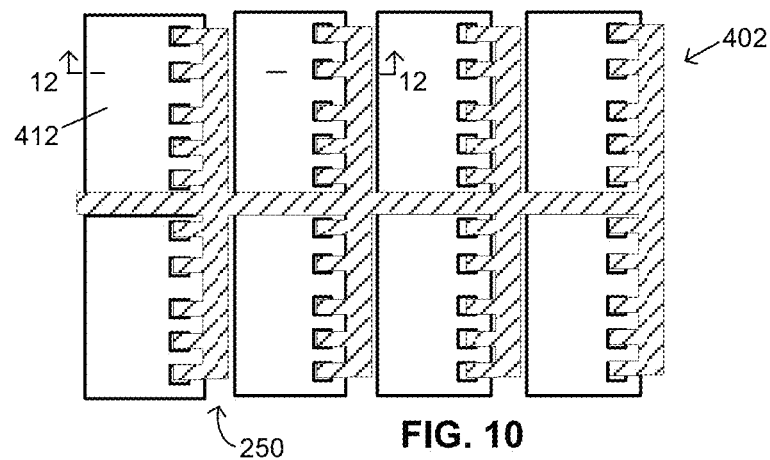
FIG. 10 is a top-down view illustrating an in-process element in accordance with a fabrication method according to an embodiment of the invention.

FIG. 8 further shows an arrangement of units 166 in panel format for forming the dielectric region surrounding the units to form the reconstituted panel or wafer. Subsequently, as seen in FIG. 10, a lead frame 250 is aligned and joined with the contacts of the microelectronic elements in one or more the units of the reconstituted panel or wafer. In this case, a single lead frame 250 may be aligned and joined simultaneously to four units containing the eight chips shown in FIG. 10. Alternatively, a single lead frame can be joined in such manner to a smaller or larger number of microelectronic elements.

Figure 9:
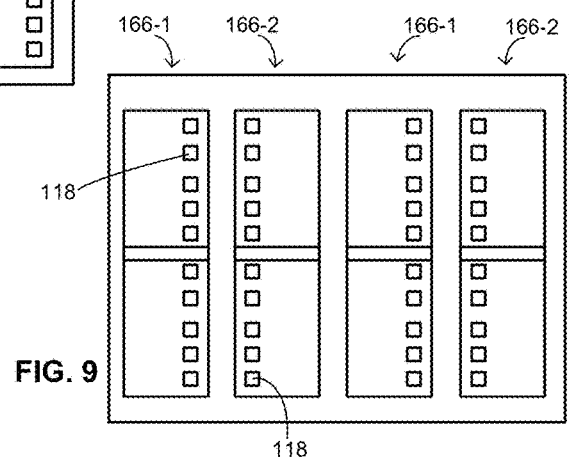
FIG. 9 is a top-down view illustrating a reconstituted panel in accordance with a fabrication method according to an embodiment of the invention.
Figure 11:
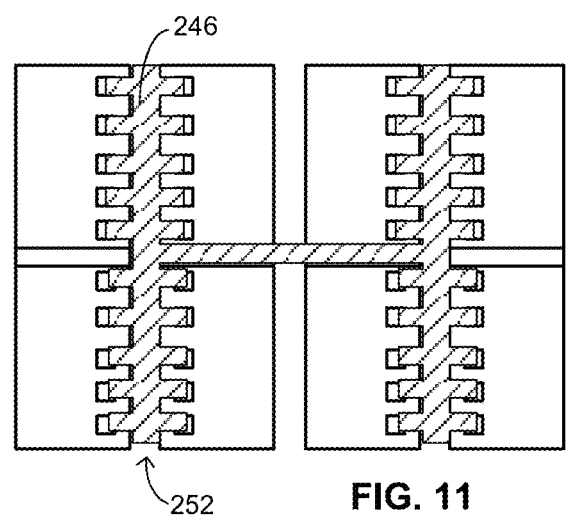
FIG. 11 is a top-down view illustrating an in-process element in accordance with a fabrication method according to an embodiment of the invention.

Referring to FIG. 9, in a variation of the method described relative to FIG. 8, units 166-1 are positioned in the reconstituted panel or wafer in a first orientation with the contacts 118 oriented towards a right-hand edge of the panel. By contrast, units 166-2 are positioned in the reconstituted panel or wafer in a second orientation with the contacts 118 oriented towards a left-hand edge of the panel. Referring to FIG. 11, this reconstituted panel arrangement may permit the lead frame 252 to be more compact, in that the support elements 246 are provided in the vertical spaces between only some of the adjacent microelectronic elements. In this way, the vertical spaces between other microelectronic elements need not be as far apart, and it may be possible to provide a greater number of microelectronic elements on the reconstituted panel than in the arrangement seen in FIG. 10.

In one example, when a molded leadframe is used in the form of a panel or a wafer, contacts of the microelectronic elements, e.g., semiconductor chips are electrically joined to the fingers of the molded leadframe before applying the encapsulation molding compound on the panel or the wafer.

Figure 12:
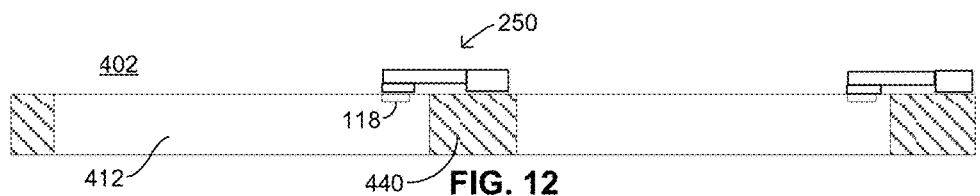
FIGS. 12, 13, 14, and 15 are sectional views each illustrating a stage in a method of fabricating a plurality of stacked microelectronic assemblies in accordance with an embodiment of the invention.
Figure 13:
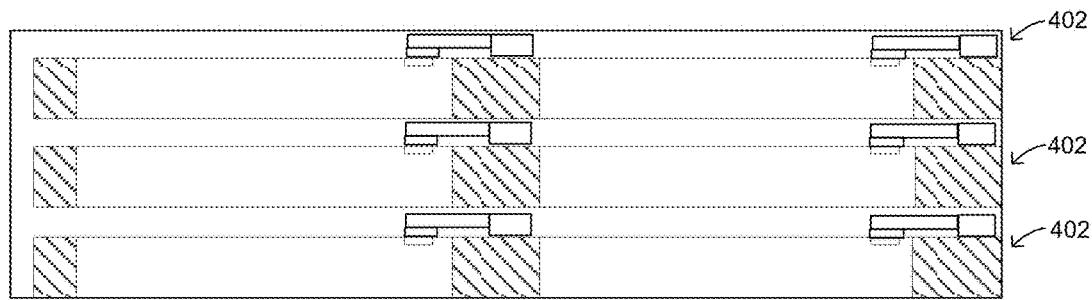

Referring now to FIGS. 10 and 12, a subassembly 402 is depicted which includes a plurality of microelectronic elements 412, and dielectric regions 440 between adjacent edges of the microelectronic elements, and the lead frame 250 attached to the contacts 118 of the microelectronic elements therein. As seen in FIG. 13, a plurality of the subassemblies 402 are stacked one atop the other and are mechanically bound together, such as through an adhesive which may extend between respective subassemblies, or may be provided on an outer perimeter of the subassemblies, or alternatively, through use of a fixture which compresses the subassemblies towards one another.

Figure 14:
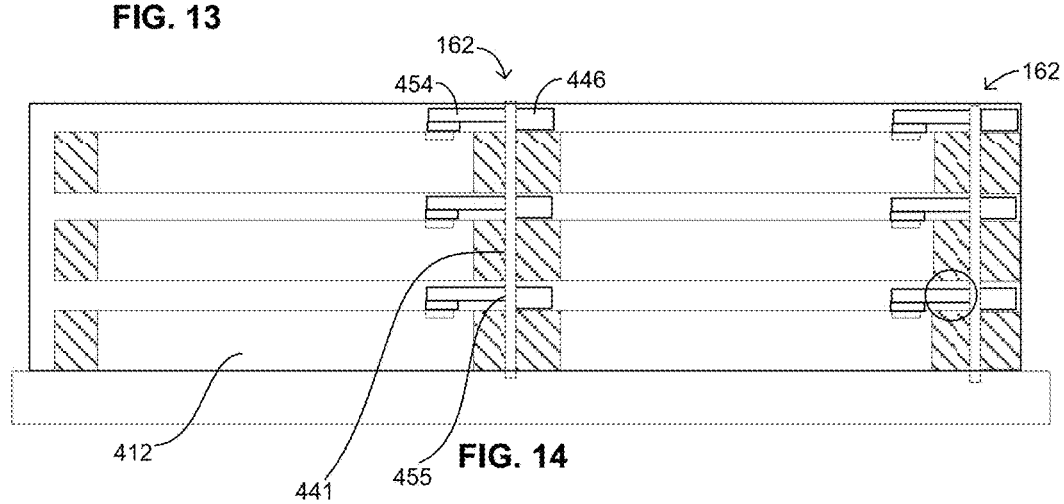

Next, as seen in FIG. 14, portions of the stacked subassemblies can be partially severed from one another by cutting along the vertical saw lanes 162 to a depth below the lead frame of the lowest subassembly. For example, the stack can be cut using a saw or laser to form channels extending in directions of the vertical dicing lanes. In one example as seen in FIG. 14, the cutting can be performed to a depth lower than a rear surface of the chips 412 in the lowest subassembly. The cutting at least partially severs the dielectric region 440 between the adjacent microelectronic elements in each subassembly, and severs the lead frame fingers 454 of the lead frame at each level of the stack from the corresponding support elements 446 to which they were formerly connected. In addition, the cutting defines ends 455 of the lead frame fingers which are now exposed.

Figure 15:
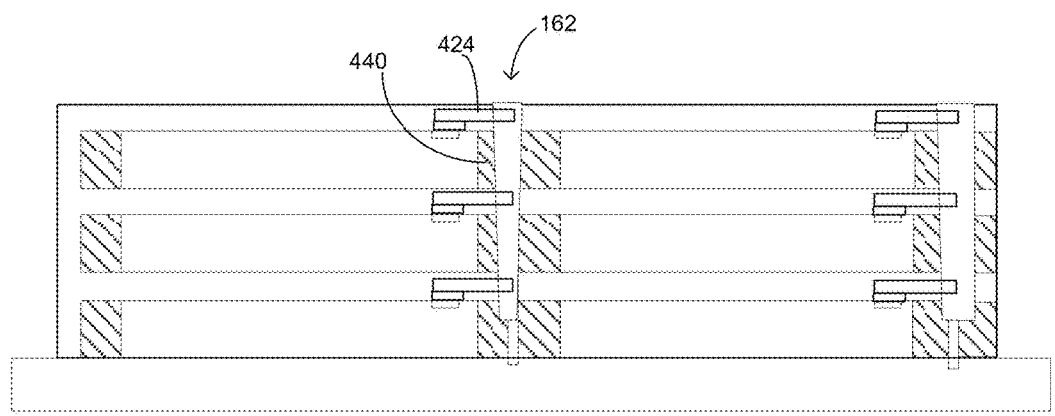

Referring to FIG. 15, a process is applied to cause dielectric region 440 disposed between the adjacent microelectronic elements to be recessed. For example, the dielectric region at surfaces of the channels can be recessed using a fluid having an etchant and/or an abrasive component which acts selectively on the dielectric region 440 relative to the metal of the lead frame to produce the structure shown. In such case, peripheral surfaces of the lead frame interconnects 424 which extend in a lengthwise direction of the lead frame interconnects are exposed by this process. After the cutting, some of the chips which are bound to one another in the reconstituted panel or which remain integrally connected with one another at the horizontal dicing lanes may still remain mechanically bound with one another by the encapsulant region 440 therein.

Figure 16:
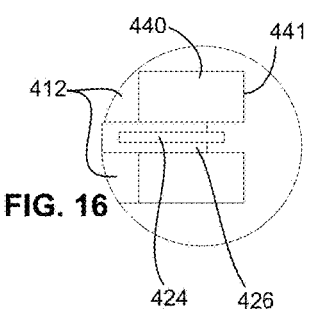
FIG. 16 is a partial fragmentary view further illustrating a method of fabricating a plurality of stacked microelectronic assemblies in accordance with a variation of the embodiment illustrated in FIG. 15.

In a particular example, as seen in FIG. 16, instead of recessing the dielectric region 440 along the entire depth of the channels as shown in FIG. 15, a selective process can be applied through the formed channels to recess dielectric adhesive material 426 which contacts the lead frame interconnects 424 in a manner that is selective to the dielectric regions 440 extending from the edge surfaces of the chips 412. This way may in some cases yield faster processing or cost less than recessing the dielectric regions 440 in the manner depicted in FIG. 15. Also, in some cases, the lead frame interconnects 424 may be flush with, or recessed relative to the edge surfaces 441 of dielectric encapsulant regions 440 on the chips immediately adjacent to the lead frame interconnect.

Although not specifically shown in the Figures or particularly described in the foregoing, elements in the various Figures and various described embodiments can be combined together in additional variations of the invention.

In further variations of the above-described embodiments, some features of the microelectronic assembly, microelectronic packages or the fabrication can be as described said incorporated U.S. Provisional Application 62/194,051 filed Jul. 17, 2015. For example, a heat spreader feature such as seen in FIG. 5 therein can be added such as to the embodiment described herein relative to FIG. 2; the end regions on microelectronic assemblies can be staggered as seen in FIG. 8 therein; dielectric regions between individual chips can have an appearance as seen in FIG. 7 therein; the chip stacks can be oriented at an angle non-orthogonal to the substrate major surface as seen for example in either FIG. 9 or FIG. 9A therein, some of the microelectronic elements in a chip stack may have an electrical interconnection arrangement as seen in FIG. 10 therein, and/or the support element in any of the embodiments seen in FIG. 1, 2 or 2A, for example, can be further electrically interconnected with a circuit panel 150 such as seen in FIG. 3 of said incorporated application.

Although the invention has been described with reference to the foregoing description and Figures, many modifications and enhancements are possible. The invention shall not be limited except in accordance with the claims appended herein or which may be derived from the present disclosure.

Although not specifically shown in the Figures or particularly described in the foregoing, elements in the various Figures and various described embodiments can be combined together in additional variations of the invention.

The invention claimed is:

1. A microelectronic assembly, comprising:
a chip stack comprising a plurality of microelectronic elements having front surfaces, each front surface defining a respective plane of a plurality of planes, each microelectronic element having a plurality of contacts at the front surface and an edge surface extending away from its front surface, and a dielectric region on an edge surface of the respective microelectronic element, the dielectric region having a remote surface displaced in a lateral direction beyond the edge surface of the respective microelectronic element;
a plurality of leadframe interconnects each electrically coupled to a contact on one of the microelectronic elements and each having an end at the remote surface of the dielectric region of the respective microelectronic element;
a support element having a plurality of electrically conductive contacts insulated from one another at a major surface thereof, the major surface defining a second plane non-parallel to the plurality of parallel planes, wherein the chip stack is mounted to the support element with the remote surfaces of the dielectric regions towards the major surface and the leadframe interconnects facing and joined with corresponding contacts at the major surface.

2. The microelectronic assembly as claimed in claim 1, wherein a plurality of the chip stacks are mounted to the support element at a separation of at least 100 microns between first and second adjacent chip stacks.

3. The microelectronic assembly as claimed in claim 1, wherein the leadframe is a molded leadframe.

4. The microelectronic assembly as claimed in claim 1, wherein the ends of the leadframe interconnects coupled to the respective microelectronic element extend beyond the remote surface of the dielectric region on the edge surface of the respective microelectronic element.

5. The microelectronic assembly as claimed in claim 1, wherein the ends of the leadframe interconnects coupled to the respective microelectronic element are flush with or recessed relative to the remote surface of the dielectric region on the edge surface of the respective microelectronic element.

6. The microelectronic assembly as claimed in claim 5, wherein the ends of the leadframe interconnects coupled to the respective microelectronic element are disposed between the dielectric region extending from the respective microelectronic element and the dielectric region extending from the microelectronic element adjacent to the respective microelectronic element.

7. The microelectronic assembly as claimed in claim 1, wherein the leadframe interconnects are metallurgically joined with the contacts on the respective microelectronic element through electrically conductive bumps consisting essentially of gold, nickel, tin or copper.

8. The microelectronic assembly as claimed in claim 1, further comprising metal superstructures deposited by a process including plating onto the contacts, each superstructure comprising a layer consisting essentially of copper and projecting at least 5 microns above the surface of the support element, wherein the leadframe interconnects are metallurgically joined directly to the metal superstructures, or are joined to the metal superstructures with an electrically conductive bond material.

9. The microelectronic assembly as claimed in claim 8, wherein the metal superstructures have areas defined by areas of major surfaces of the contacts.

10. A microelectronic assembly, comprising:
a chip stack comprising a plurality of microelectronic elements having front surfaces, each front surface defining a respective plane of a plurality of planes, each microelectronic element having a plurality of contacts at the front surface and an edge surface extending away from its front surface in a first direction transverse to its front surface, and a dielectric region overlying an edge surface of the respective microelectronic element, the dielectric region extending from the edge surface in a second direction transverse to the edge surface to a remote surface displaced in the second direction beyond the edge surface of the respective microelectronic element;

a plurality of leadframe interconnects each electrically coupled to a contact on one of the microelectronic elements and each having an end at the remote surface of the dielectric region of the respective microelectronic element;

a support element having a plurality of electrically conductive contacts insulated from one another at a major surface thereof, the major surface defining a second plane non-parallel to the plurality of parallel planes, wherein the chip stack is mounted to the support element with the remote surfaces of the dielectric regions towards the major surface and the leadframe interconnects facing and joined with corresponding contacts at the major surface.

11. The microelectronic assembly as claimed in claim 10, wherein the remote surface of the dielectric region of each of the microelectronic elements is closer to the major surface of the support element than the edge surface of the respective microelectronic element.

12. The microelectronic assembly as claimed in claim 10, further comprising a reinforcing underfill material surrounding individual connections between the leadframe interconnects and the contacts of the support element.

13. The microelectronic assembly as claimed in claim 12, wherein each of the dielectric regions extends at least partially into the reinforcing underfill material in the second direction.

* * * * *